(12) United States Patent
Chuang et al.

(10) Patent No.: US 11,265,561 B2
(45) Date of Patent: *Mar. 1, 2022

(54) METHOD AND APPARATUS FOR RANGE DERIVATION IN CONTEXT ADAPTIVE BINARY ARITHMETIC CODING

(71) Applicant: MEDIATEK INC., Hsin-Chu (TW)

(72) Inventors: Tzu-Der Chuang, Hsinchu (TW); Ching-Yeh Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 804 days.

This patent is subject to a terminal disclaimer.

(21) Appl. No.: 15/863,547

(22) Filed: Jan. 5, 2018

(65) Prior Publication Data

US 2018/0199046 A1 Jul. 12, 2018

Related U.S. Application Data

(60) Provisional application No. 62/443,012, filed on Jan. 6, 2017.

(51) Int. Cl.
*H04N 19/159* (2014.01)
*H04N 19/192* (2014.01)
(Continued)

(52) U.S. Cl.
CPC ........ *H04N 19/192* (2014.11); *H03M 7/4006* (2013.01); *H03M 7/4018* (2013.01);
(Continued)

(58) Field of Classification Search
CPC .... H04N 19/192; H04N 19/13; H04N 19/157; H04N 19/91; H04N 19/184; H03M 7/4006; H03M 7/4018
See application file for complete search history.

(56) References Cited

U.S. PATENT DOCUMENTS 9,425,822 B2 * 8/2016 Zhou .................. H03M 7/4018
9,521,433 B2 12/2016 Chono et al.
(Continued)

FOREIGN PATENT DOCUMENTS

CN 101933331 A 12/2010
CN 102223149 A 10/2011
(Continued)

OTHER PUBLICATIONS

European Search Report dated Jul. 15, 2020, issued in application No. EP 18736507.7.
(Continued)

*Primary Examiner* — Patrick E Demosky
(74) *Attorney, Agent, or Firm* — McClure, Qualey & Rodack, LLP

(57) ABSTRACT

A method and apparatus of entropy coding of coding symbols using Context-Based Adaptive Binary Arithmetic Coder (CABAC) are disclosed. According to the present invention, CABAC encoding or decoding is applied to a current bin of a binary data of a current coding symbol according to a current probability for a binary value of the current bin and a current range associated with the current state of arithmetic coder. An LPS probability index corresponding to an inverted current probability or the current probability is derived depending on whether the current probability is greater than 0.5. A range index is derived for identifying one range interval containing the current range. An LPS range is then derived using one or more mathematical operations comprising calculating a multiplication of a first value related to the LPS probability index and a second value related to the range index n.

15 Claims, 2 Drawing Sheets

(51) Int. Cl.
*H04N 19/157* (2014.01)
*H04N 19/13* (2014.01)
*H03M 7/40* (2006.01)
*H04N 19/91* (2014.01)

(52) U.S. Cl.
CPC ........... *H04N 19/13* (2014.11); *H04N 19/157* (2014.11); *H04N 19/91* (2014.11)

(56) References Cited

U.S. PATENT DOCUMENTS

| | | | |
|---|---|---|---|
| 2003/0059911 A1 | 3/2003 | Yamaoka et al. | |
| 2005/0123207 A1 | 6/2005 | Marpe et al. | |
| 2008/0198933 A1 | 8/2008 | Srinivasan et al. | |
| 2013/0107951 A1* | 5/2013 | Sole Rojals | H03M 7/4018 375/240.12 |
| 2014/0092985 A1* | 4/2014 | Kim | H04N 19/129 375/240.25 |
| 2016/0043735 A1 | 2/2016 | Zhou | |
| 2016/0353110 A1 | 12/2016 | Zhang et al. | |
| 2016/0353113 A1* | 12/2016 | Zhang | H04N 19/625 |
| 2018/0199046 A1 | 7/2018 | Chuang et al. | |
| 2018/0199048 A1 | 7/2018 | Said et al. | |

FOREIGN PATENT DOCUMENTS

| | | |
|---|---|---|
| CN | 103227924 A | 7/2013 |
| CN | 104918049 A | 9/2015 |
| CN | 105007486 A | 10/2015 |
| JP | H11112355 A | 4/1999 |
| TW | 201701664 A | 1/2017 |
| TW | 201832554 A | 9/2018 |
| WO | 2016/045565 A1 | 3/2016 |
| WO | 2016/184399 A1 | 11/2016 |

OTHER PUBLICATIONS

Anonymous; "Probability;" Wikipedia; Dec. 2016; pp. 1-10.
Alshin, A., et al.; "Multi-parameter probability up-date for CABAC;" Joint Collaborative Team on Video Coding (JCT-VC) of ITU-T SG16 WP3 and ISO/IEC JTC1/SC29/WG11; Jul. 2011; pp. 1-5.
International Search Report and Written Opinion, dated Sep. 27, 2018, from PCT/CN2018/095419.
Alshin, Alexander et al., 'High precision probability estimation for CABAC' (published on Dec. 31, 2013).
Taiwan Office Action, dated Sep. 14, 2020, in application No. 10920092070.
Yu et al., "A High Performance CABAC Decoding Architecture" (published in Nov. 2005).
Marpe et al., "Context-Based Adaptive Binary Arithmetic Coding in the H.264/AVC Video Compression Standard" ((published in Jul. 2003).
U.S. Non-Final Office Action, dated Sep. 11, 2020, in U.S. Appl. No. 16/629,440.
Chinese language office action dated Apr. 2, 2021, issued in application No. CN 201880006060.0.

* cited by examiner

METHOD AND APPARATUS FOR RANGE DERIVATION IN CONTEXT ADAPTIVE BINARY ARITHMETIC CODING

CROSS REFERENCE TO RELATED APPLICATIONS

The present invention claims priority to U.S. Provisional Patent Application Ser. No. 62/443,012, filed on Jan. 6, 2017. The U.S. Provisional Patent Application is hereby incorporated by reference in its entirety.

FIELD OF THE INVENTION

The present invention relates to entropy coding techniques for image coding and video coding. In particular, the present invention relates to range derivation for Context-Based Adaptive Binary Arithmetic Coder (CABAC) for image coding and video coding.

BACKGROUND AND RELATED PRIOR ART

The arithmetic coding is known as one of the efficient data compressing methods, and is widely used in coding standards, including JBIG, JPEG2000, H.264/AVC, and High-Efficiency Video Coding (HEVC). In H.264/AVC and HEVC Test Model Version 16.0 (HM-16.0), context-based adaptive binary arithmetic coding (CABAC) is adopted as the entropy coding tool in the video coding system.

As shown in FIG. 1, CABAC consists of three parts: binarization unit 110, context modelling unit 120, and binary arithmetic coding unit 130. In the binarization step, each syntax element is uniquely mapped into a binary string (bin or bins). In the context modelling step, a probability model is selected for each bin. The corresponding probability model may depend on previously encoded syntax elements, bin indexes, and side information. After the binarization and the context model assignment, a bin value along with its associated model is transmitted to the binary arithmetic coding engine.

Binary arithmetic coding is a recursive interval-subdividing procedure. The output bitstream is the pointer to the final probability of coding interval. The probability of coding interval, T is specified by range and the lower bound of coding interval (designated as "low" in the following discussion). The range is the possible scope of the coding interval. Depending on whether the current symbol is the most probable symbol (MPS) or the least probable symbol (LPS), the next coding interval is updated as one of the two sub-intervals accordingly, as shown in eq. (1) and eq. (2).

$$range_{n+1} = \begin{cases} range_n - rangeLPS_n, & \text{if } MPS \\ rangeLPS_n, & \text{if } LPS \end{cases} \quad (1)$$

$$low_{n+1} = \begin{cases} low_n, & \text{if } MPS \\ low_n + range_n - rangeLPS_n, & \text{if } LPS \end{cases} \quad (2)$$

where rangeLPS is the estimated range when LPS is coded.

FIG. 2 illustrates the concept of the binary arithmetic coding. Initially, the probability range (i.e., $range_0$) is 1 and the low boundary (i.e., $low_0$) is 0 as indicated by probability scale 210. If the first symbol is a MPS symbol, a pointer in the lower part of the probability scale 210 may be used to signal the event of an MPS symbol. The $range_1$ is used as the probability scale 220 for processing the next symbol. Again, the probability scale 220 is divided into two parts for MPS and LPS respectively. If the second symbol is an LPS symbol, the $rangeLPS_1$ is selected as the probability scale 230 for the next symbol. Every time when a new symbol is coded, the corresponding range becomes smaller. When a range becomes too small, the range can be re-normalized to form a probability scale 240 with larger range.

In modern arithmetic coding, the probability update is often done according to a model. For example, a method is described by Marpe, et al., in a technical publication ("Context-Based Adaptive Binary Arithmetic Coding in the H.264/AVC Video Compression Standard", *IEEE Transactions on Circuits and Systems for Video Technology*, Vol. 13, No. 7, pp. 620-636, July 2003), where the following formula is used:

$$p_{new} = (1-\alpha) \cdot y + \alpha p_{old}. \quad (3)$$

In the above equation, y is equal to 0 if current symbol is a most probable symbol (MPS); otherwise, y is equal to 1. This formula provides an estimated value for probability of the least probable symbol (LPS). The weighting $\alpha$ is derived according to the following equation:

$$\alpha = (min\_prob/0.5)^{(1/state\_number)}, \quad (4)$$

where min_prob corresponds to the minimum probability of the least probable symbol of CABAC and state_number corresponds to the number of context states for probability value estimation.

For CABAC of HEVC, there are 64 probability states. The min_prob is 0.01875, and the state_number is 63. Each state has a probability value indicating the probability to select the LPS. The 64 representative probability values, $p_\sigma \in [0.01875, 0.5]$, were derived for the LPS by the following recursive equation:

$$P_\sigma = \alpha \cdot P_{\sigma-1} \text{ for all } \sigma=1, \ldots, 63,$$

with $\alpha = (0.01875/0.5)^{1/63}$ and $p_0 = 0.5$ \quad (5)

The rangeLPS value of a state $\sigma$ is derived by the following equation:

$$rangeLPS\sigma = RANGE \times P_\sigma \quad (6)$$

To reduce the computations required for deriving rangeLPS, the result of rangeLPS of each range value can be pre-calculated and stored in a lookup table (LUT). In H.264/AVC and HEVC, a 4-column pre-calculated rangeLPS table is adopted to reduce the table size as shown in Table 1. The range is divided into four segments. In each segment, the rangeLPS of each probability state $\sigma$ ($p_\sigma$) is pre-defined. In other words, the rangeLPS of a probability state $\sigma$ is quantized into four values. The rangeLPS selected depends on the segment that the range belongs to.

TABLE 1

| | (Range>>6)&3 | | | |
| --- | --- | --- | --- | --- |
| | | Sets | | |
| | 0 | 1 | 2 | 3 |
| | | Range Min | | |
| | 256 | 320 | 384 | 448 |
| | | Range Max | | |
| State | 319 | 383 | 447 | 510 |
| | | Range LPS | | |
| 0 | 128 | 176 | 208 | 240 |
| 1 | 128 | 167 | 197 | 227 |
| 2 | 128 | 158 | 187 | 216 |

TABLE 1-continued

| | (Range>>6)&3 Sets | | | |
|---|---|---|---|---|
| | 0 | 1 | 2 | 3 |
| | Range Min | | | |
| | 256 | 320 | 384 | 448 |
| | Range Max | | | |
| | 319 | 383 | 447 | 510 |
| State | Range LPS | | | |
| 3 | 123 | 150 | 178 | 205 |
| 4 | 116 | 142 | 169 | 195 |
| 5 | 111 | 135 | 160 | 185 |
| 6 | 105 | 128 | 152 | 175 |
| 7 | 100 | 122 | 144 | 166 |
| 8 | 95 | 116 | 137 | 158 |
| 9 | 90 | 110 | 130 | 150 |
| 10 | 85 | 104 | 123 | 142 |
| 11 | 81 | 99 | 117 | 135 |
| 12 | 77 | 94 | 111 | 128 |
| 13 | 73 | 89 | 105 | 122 |
| 14 | 69 | 85 | 100 | 116 |
| 15 | 66 | 80 | 95 | 110 |
| 16 | 62 | 76 | 90 | 104 |
| 17 | 59 | 72 | 86 | 99 |
| 18 | 56 | 69 | 81 | 94 |
| 19 | 53 | 65 | 77 | 89 |
| 20 | 51 | 62 | 73 | 85 |
| 21 | 48 | 59 | 69 | 80 |
| 22 | 46 | 56 | 66 | 76 |
| 23 | 43 | 53 | 63 | 72 |
| 24 | 41 | 50 | 59 | 69 |
| 25 | 39 | 48 | 56 | 65 |
| 26 | 37 | 45 | 54 | 62 |
| 27 | 35 | 43 | 51 | 59 |
| 28 | 33 | 41 | 48 | 56 |
| 29 | 32 | 39 | 46 | 53 |
| 30 | 30 | 37 | 43 | 50 |
| 31 | 29 | 35 | 41 | 48 |
| 32 | 27 | 33 | 39 | 45 |
| 33 | 26 | 31 | 37 | 43 |
| 34 | 24 | 30 | 35 | 41 |
| 35 | 23 | 28 | 33 | 39 |
| 36 | 22 | 27 | 32 | 37 |
| 37 | 21 | 26 | 30 | 35 |
| 38 | 20 | 24 | 29 | 33 |
| 39 | 19 | 23 | 27 | 31 |
| 40 | 18 | 22 | 26 | 30 |
| 41 | 17 | 21 | 25 | 28 |
| 42 | 16 | 20 | 23 | 27 |
| 43 | 15 | 19 | 22 | 25 |
| 44 | 14 | 18 | 21 | 24 |
| 45 | 14 | 17 | 20 | 23 |
| 46 | 13 | 16 | 19 | 22 |
| 47 | 12 | 15 | 18 | 21 |
| 48 | 12 | 14 | 17 | 20 |
| 49 | 11 | 14 | 16 | 19 |
| 50 | 11 | 13 | 15 | 18 |
| 51 | 10 | 12 | 15 | 17 |
| 52 | 10 | 12 | 14 | 16 |
| 53 | 9 | 11 | 13 | 15 |
| 54 | 9 | 11 | 12 | 14 |
| 55 | 8 | 10 | 12 | 14 |
| 56 | 8 | 9 | 11 | 13 |
| 57 | 7 | 9 | 11 | 12 |
| 58 | 7 | 9 | 10 | 12 |
| 59 | 7 | 8 | 10 | 11 |
| 60 | 6 | 8 | 9 | 11 |
| 61 | 6 | 7 | 9 | 10 |
| 62 | 6 | 7 | 8 | 9 |
| 63 | 2 | 2 | 2 | 2 |

In Table 1, ">>" represents the right shift operation. In JCTVC-F254 (Alshin et al., Multi parameter probability up-date for CABAC, Joint Collaborative Team on Video Coding (JCT-VC) of ITU-T SG16 WP3 and ISO/IEC JTC1/SC29/WG11, 6th Meeting: Torino, IT, 14-22 July, 2011, Document: JCTVC-F254), Alshin, et al., disclose a multi-parameter probability update for the CABAC of the HEVC standard. The parameter $N=1/(1-\alpha)$ is an approximate measurement for number of previously encoded bins (i.e., "window size") that have significant influence on the current bin. The choice of parameter N determines sensitivity of the model. A sensitive system will react to real changing quickly. On the other hand, a less sensitive model will not react to noise and random errors. Both properties are useful but contradictory. Accordingly, Alshin, et al., disclose a method to calculate several values with different $\alpha_i$ simultaneously:

$$p_{i\_new}=(1-\alpha_i)\cdot y+\alpha_i p_{i\_old} \tag{7}$$

and use weighted average as next bin probability prediction:

$$p_{new}=\Sigma(\beta_i \cdot p_{i\_new}), \tag{8}$$

where $\beta_i$ is a weighting factor associated with $\alpha_i$.

Instead of state transition lookup tables (m_aucNextStateMPS and m_aucNextStateLPS) utilized in CABAC of the AVC standard for updating the state and its corresponding probability, Alshin, et al., use the explicit calculation with multiplication free formula for probability update. Assuming that probability $p_i$ is represented by integer number $P_i$ from 0 to $2^k$ (i.e., $p_i=P_i/2^k$) and $\alpha_i$ is represented by 1 over a power of two number (i.e., $\alpha_i=\frac{1}{2}^{M_i}$), multiplication free formula for probability update can be derived as follows:

$$P_i=(Y>>M_i)+P-(P_i>>M_i). \tag{9}$$

This formula predicts probability that next bin will be "1", where $Y=2^k$ if the last coding bin is "1", $Y=0$ if the last coding bin is "0", and ">>$M_i$" corresponds to the right shift by $M_i$ bits operation.

To keep balance between complexity increase and performance improvement, it is considered that linear combination for probability estimation consists of only two parameters:

$$P_0=(Y>>4)+P_0-(P_0>>4), \tag{10}$$

$$P_1=(Y>>7)+P_1-(P_0>>7), \text{ and} \tag{11}$$

$$P=(P+P_1+P_1+1)>>1. \tag{12}$$

Floating point value that corresponds to probability for AVC CABAC is always less than or equal to ½. If the probability exceeds this limit, LPS becomes MPS to keep probability inside interval mentioned above. It needs MPS/LPS switching when the probability of MPS/LPS is larger than 0.5. Alshin, et al., proposed to increase permissible level of probability (in terms of float-point values) up to 1 to avoid MPS/LPS switching. Therefore, one lookup table (LUT) for storing RangeOne or RangeZero is derived.

In VCEG-AZ07 (Chen, et al., "*Further improvements to HMKTA-1.0*", ITU-T Video Coding Experts Group (VCEG) meeting, Warsaw, Poland, IT, 19-26 Jun. 2015, Document: VCEG-AZ07), Chen, et al., proposed to use a single parameter CABAC. The probability derivation is the same as JCTVC-F254, which uses eq. (9) to derive the probability of being one or zero. For each context, only one updating speed is used, which means for each context, only one N is used. However, different contexts can use different N's. The range for N is from 4 to 7, and a 2-bit variable is used to indicate the probability updating speed for a specific context model. The N value is determined at the encoder side and signalled in the bitstream.

In JCTVC-F254 and VCEG-AZ07, the LUT of RangeOne or RangeZero is a 64-column by 512-row table. The input of the LUT is current range and the current probability. The valid range of the current range is from 256 to 510. The current range is divided into 64 sections, where each section contains 4 values of current range (e.g. 256 to 259, 260 to 263, etc.). The section index of range can be derived by:

$$rangeIdx=(range>>2)-64, \text{ or} \quad (13)$$

$$rangeIdx=(range>>2)\&63 \quad (14)$$

The valid range of the current probability (P) is from 0 to $2^k-1$. In JCTVC-F254 and VCEG-AZ07, the k is 15. The current probability is divided into 512 sections, where each section contains 64 values of current probability (e.g. 0 to 63, 64 to 127, etc.). The section index of probability can be derived by $$probIdx=(P>>6). \quad (15)$$

The RangeOne value can be derived by table lookup, for example $$RangeOne=tableRangeOne[rangeIdx][probIdx] \quad (16)$$

Each value in tableRangeOne is derived by $$EntryValue=Round(clip3(3,MinRange-3,MinRange*(probIdx+0.5)/M)), \quad (17)$$

where MinRange is the lowest range value of the derived rangeIdx. The clip3(X, Y, Z) is to clip the Z value within the range of X to Y. The Round is to round the value to an integer.

For example, the range section for rangeIdx=0 is 256 to 259, the MinRange is 256. The MinRange can be derived by $$MinRange=256+(rangeIdx<<2) \quad (18)$$

The M is the maximum value of (probIdx+1). For example, in JCTVC-F254 and VCEG-AZ07, the M is 512. The clip3(X, Y, Z) is to clip the Z value within the range of X to Y. The Round is to round the value to integer.

In JCTVC-F254 and VCEG-AZ07, the size of lookup tables becomes very large. It is desirable to overcome the issue without degrading the coding performance or increasing the computational complexity noticeably.

BRIEF SUMMARY OF THE INVENTION

A method and apparatus of entropy coding of coding symbols using Context-Based Adaptive Binary Arithmetic Coder (CABAC) are disclosed. According to the present invention, context-adaptive arithmetic encoding or decoding is applied to a current bin of a binary data of a current coding symbol according to a current state of the arithmetic coder for a binary value of the current bin and a current range associated with the current probability, where the current probability is generated according to one or more previously coded symbols before the current coding symbol. An LPS probability index corresponding to an inverted current probability or the current probability is derived depending on whether the current probability for the binary value of the current bin is greater than 0.5. A range index is derived for identifying one range interval containing the current range. An LPS range is then derived using one or more mathematical operations comprising calculating a multiplication of a first value related to the LPS probability index and a second value related to the range index for encoding or decoding a binary value of the current bin.

In one embodiment, if the current probability for the binary value of the current bin is greater than 0.5, an LPS (least probable-symbol) probability is set equal to (1–the current probability) and otherwise, the LPS probability is set equal to the current probability; and the LPS probability index is determined based on a target index indicating one probability interval containing the current probability. In another embodiment, if the current probability for the binary value of the current bin is greater than 2k–1 or is greater than or equal to 2k–1, the LPS probability is set equal to (2k–the current probability) and otherwise, the LPS probability is set equal to the current probability; and the LPS probability index is set equal to 1 plus a result of right-shifting the LPS probability by (k–n–1) bits; and wherein the current probability is represented by k-bit values, and n and m are positive integers. In yet another embodiment, if the current probability for the binary value of the current bin is greater than $2^{k-1}$ or is greater than or equal to $2^{k-1}$, the LPS probability index is set equal to ($2^{n+1}$—a result of right-shifting the current probability by (k–n–1) bits), and otherwise, the LPS probability index is set equal to (1 plus the result of right-shifting the current probability by (k–n–1) bits); and wherein the current probability is represented by k-bit values, and n is a positive integer. In yet another embodiment, wherein if the current probability for the binary value of the current bin is greater than $2^{k-1}$ or is greater than or equal to $2^{k-1}$, the LPS probability index is set equal to ($2^{n+1}$—a result of right-shifting the current probability by (k–n–1) bits), and otherwise, the LPS probability index is set equal to a maximum of 1 and a result of right-shifting the current probability by (k–n–1) bits. In still yet another embodiment, if the current probability for the binary value of the current bin is greater than $2^{k-1}$ or is greater than or equal to $2^{k-1}$, the LPS probability index is set equal to (($2^{n+1}$—a result of right-shifting the current probability by (k–n–1)) bits–1), and otherwise, the LPS probability index is set equal to a maximum of 1 and a result of right-shifting the current probability by (k–n–1) bits.

The method may further comprise deriving, from the current range, a rangeOne value and a rangeZero value for the current bin having a value of one and a value of zero respectively. If the current probability for the binary value of the current bin is greater than 0.5 or is greater than or equal to 0.5, the rangeOne value is set to (the current range–the LPS range) and the rangeZero value is set to the LPS range; and otherwise, the rangeZero value is set to (the current range–the LPS range) and the rangeOne value is set to the LPS range. The LPS range can be derived by multiplying the LPS probability index and the range index or multiplying (the LPS probability index plus 1) and the range index to obtain a multiplication result and then right-shifting the multiplication result by an x bits and x corresponds to a positive integer. The LPS range can be derived by multiplying the LPS probability index and the range index or multiplying (the LPS probability index plus 1) and the range index to obtain a multiplication result, and right-shifting the multiplication result plus an offset by an x bits and x is a positive integer, wherein the offset is a positive integer or a value corresponding to the range index or the current range. For example, the x may correspond to (k–n–m–6), where the current probability is represented by k-bit values, and n and m are positive integers.

The current probability can be represented by k-bit values and the LPS probability index is derived using operations comprising right-shifting the current probability by (k–n–1) bits, where n is a positive integer. The current probability can be represented by k-bit values and the LPS probability index can be derived using a result of right-shifting the current probability by (k–n–1) bits or using an inverted result of right-shifting the current probability by (k–n–1) bits depending on whether the current probability is greater than $2^{k-1}$ or whether the current probability is greater than or equal to $2^{k-1}$, wherein n is a positive integer. The range index can be derived by right-shifting the current probability by (q−m) bits, wherein q and m are positive integers and q is greater than m.

The first value related to the LPS probability index may correspond to a minimum LPS probability value, a maximum LPS probability value or a middle LPS probability value of a probability interval associated with the LPS probability index. The second value related to the range index may correspond to a minimum range value, a maximum range value or a middle range value of a range interval associated with the range index.

In one embodiment, the result of LPS range is stored in a pre-defined look up table; and the LPS range is derived by using table look up; where the row index and column index of the look up table are corresponding to the LPS probability index and range index.

DETAILED DESCRIPTION OF THE INVENTION

Figure 1:
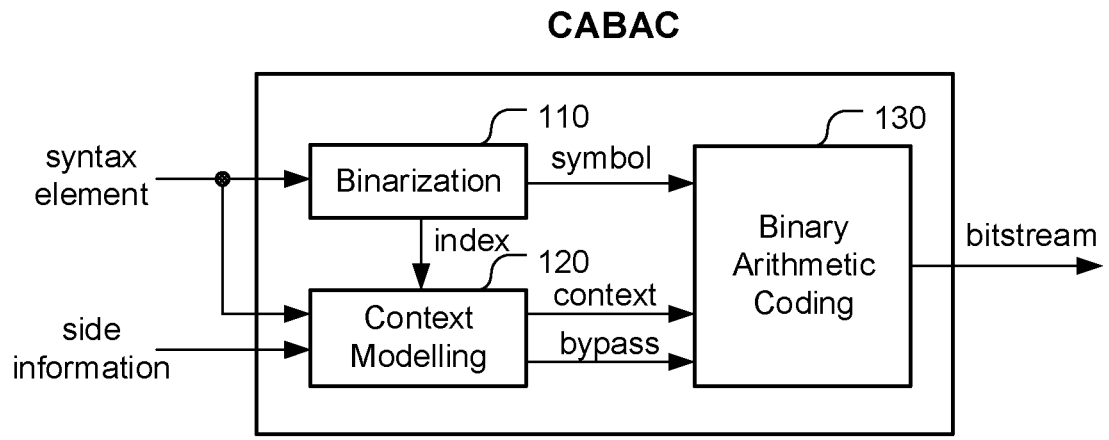
FIG. 1 illustrates a basic structure of context-based adaptive binary arithmetic coding (CABAC).
Figure 2:
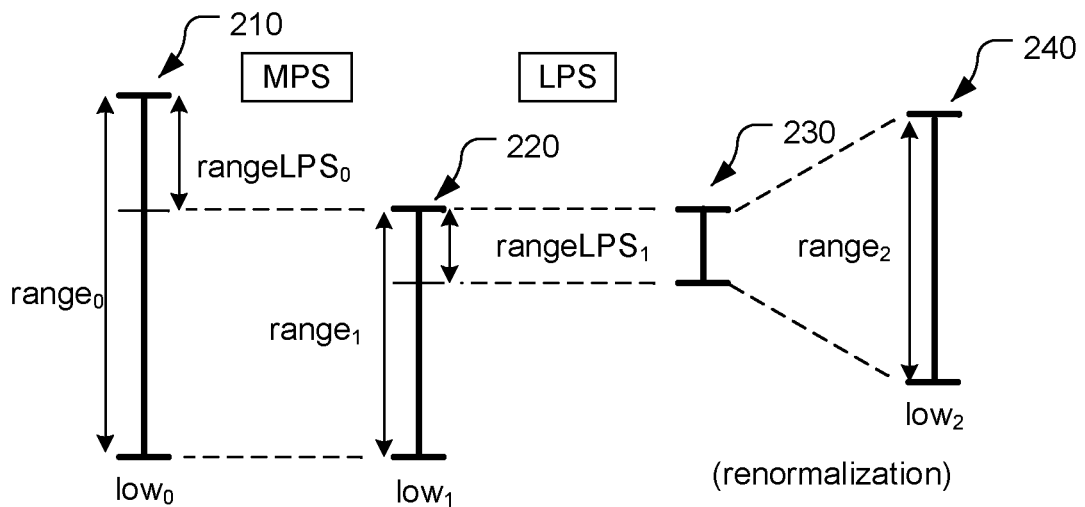
FIG. 2 illustrates a concept of the binary arithmetic coding, where initially, the probability range (i.e., $range_0$) is 1 and the low boundary (i.e., $low_0$) is 0 as indicated by a probability scale.

The following description is of the best-contemplated mode of carrying out the invention. This description is made for the purpose of illustrating the general principles of the invention and should not be taken in a limiting sense. The scope of the invention is best determined by reference to the appended claims.

In JCTVC-F254 and VCEG-AZ07, the rangeOne table covers the probability from 0.0 to 1.0. The LUT of JCTVC-F254 is 144 times of the LUT of HEVC, which is too large to be implemented in terms of hardware cost. Moreover, since the entry value of the RangeOne or RangeZero is derived from the MinRange (i.e., eq. 17), the coding efficiency will be dropped dramatically if a down-sampled LUT is used.

Therefore, it is proposed to store the probability range from 0.0 to 0.5 only. The values in the other half table can be derived by using "range−rangeLPS". In other words, if the probability range is in the other half (i.e., from 0.5 to 1), the LPS probability can be inverted so that the stored probability range from 0.0 to 0.5 can be used. The inverted probability refers to (1−the LPS probability) in this disclosure. The number of rows in the rangeLPS table defines the resolution of the probabilities. For example, we can design a rangeLPS table with 64 rows for probability range equal to 0.5 to 0.0. Each row represents the rangeLPS for a probability range of 1/64. The value of rangeLPS is derived by (range A)*(Prob B). For example, Table 2 shows a rangeLPS table with 4 columns and 64 rows. The first row represents the rangeLPS for probability within 63/128 to 64/128 in four different range sections. In Table 2, the range A is range Mid and Prob B is Prob Max. The value of rangeLPS is derived by (range Mid)*(Prob Max). Table 3 shows another value derivation method that rangeLPS is derived by (range Mid)*(Prob Max) with a 32×8 table. In JCTVC-F254 and VCEG-AZ07, for Table 2, if the probability of one is larger than 0.5 (e.g. 0.64), it means that the probability of zero is 0.36 (i.e., 0.36=1.0-0.64). The probability 0.36 (i.e., in $18^{th}$ row) will be used to find the range for rangeZero since 0.36 belongs to the corresponding range (i.e., 47/128>0.36>46/128). The rangeOne can be derived by (range−rangeZero). The table can also be derived by using (range Min)*(Prob Max) as shown in Table 4.

TABLE 2

| | | | (Range>>6)&3 rangeIdx | | | |
|---|---|---|---|---|---|---|
| | | | 0 | 1 | 2 | 3 |
| | | | | range Min | | |
| | | | 256 | 320 | 384 | 448 |
| | | | | range Max | | |
| | | | 319 | 383 | 447 | 511 |
| | | | | range Mid | | |
| Prob Max | Prob Min | probIdx | 288 | 352 | 416 | 480 |
| 64/128 | 63/128 | 63 | 144 | 176 | 208 | 240 |
| 63/128 | 62/128 | 62 | 142 | 173 | 205 | 236 |
| 62/128 | 61/128 | 61 | 140 | 171 | 202 | 233 |
| 61/128 | 60/128 | 60 | 137 | 168 | 198 | 229 |
| 60/128 | 59/128 | 59 | 135 | 165 | 195 | 225 |
| 59/128 | 58/128 | 58 | 133 | 162 | 192 | 221 |
| 58/128 | 57/128 | 57 | 131 | 160 | 189 | 218 |
| 57/128 | 56/128 | 56 | 128 | 157 | 185 | 214 |
| 56/128 | 55/128 | 55 | 126 | 154 | 182 | 210 |
| 55/128 | 54/128 | 54 | 124 | 151 | 179 | 206 |
| 54/128 | 53/128 | 53 | 122 | 149 | 176 | 203 |
| 53/128 | 52/128 | 52 | 119 | 146 | 172 | 199 |
| 52/128 | 51/128 | 51 | 117 | 143 | 169 | 195 |
| 51/128 | 50/128 | 50 | 115 | 140 | 166 | 191 |
| 50/128 | 49/128 | 49 | 113 | 138 | 163 | 188 |
| 49/128 | 48/128 | 48 | 110 | 135 | 159 | 184 |
| 48/128 | 47/128 | 47 | 108 | 132 | 156 | 180 |
| 47/128 | 46/128 | 46 | 106 | 129 | 153 | 176 |
| 46/128 | 45/128 | 45 | 104 | 127 | 150 | 173 |
| 45/128 | 44/128 | 44 | 101 | 124 | 146 | 169 |
| 44/128 | 43/128 | 43 | 99 | 121 | 143 | 165 |
| 43/128 | 42/128 | 42 | 97 | 118 | 140 | 161 |
| 42/128 | 41/128 | 41 | 95 | 116 | 137 | 158 |
| 41/128 | 40/128 | 40 | 92 | 113 | 133 | 154 |
| 40/128 | 39/128 | 39 | 90 | 110 | 130 | 150 |
| 39/128 | 38/128 | 38 | 88 | 107 | 127 | 146 |
| 38/128 | 37/128 | 37 | 86 | 105 | 124 | 143 |
| 37/128 | 36/128 | 36 | 83 | 102 | 120 | 139 |
| 36/128 | 35/128 | 35 | 81 | 99 | 117 | 135 |
| 35/128 | 34/128 | 34 | 79 | 96 | 114 | 131 |
| 34/128 | 33/128 | 33 | 77 | 94 | 111 | 128 |
| 33/128 | 32/128 | 32 | 74 | 91 | 107 | 124 |
| 32/128 | 31/128 | 31 | 72 | 88 | 104 | 120 |
| 31/128 | 30/128 | 30 | 70 | 85 | 101 | 116 |
| 30/128 | 29/128 | 29 | 68 | 83 | 98 | 113 |
| 29/128 | 28/128 | 28 | 65 | 80 | 94 | 109 |
| 28/128 | 27/128 | 27 | 63 | 77 | 91 | 105 |
| 27/128 | 26/128 | 26 | 61 | 74 | 88 | 101 |
| 26/128 | 25/128 | 25 | 59 | 72 | 85 | 98 |
| 25/128 | 24/128 | 24 | 56 | 69 | 81 | 94 |
| 24/128 | 23/128 | 23 | 54 | 66 | 78 | 90 |
| 23/128 | 22/128 | 22 | 52 | 63 | 75 | 86 |
| 22/128 | 21/128 | 21 | 50 | 61 | 72 | 83 |
| 21/128 | 20/128 | 20 | 47 | 58 | 68 | 79 |
| 20/128 | 19/128 | 19 | 45 | 55 | 65 | 75 |
| 19/128 | 18/128 | 18 | 43 | 52 | 62 | 71 |
| 18/128 | 17/128 | 17 | 41 | 50 | 59 | 68 |
| 17/128 | 16/128 | 16 | 38 | 47 | 55 | 64 |
| 16/128 | 15/128 | 15 | 36 | 44 | 52 | 60 |
| 15/128 | 14/128 | 14 | 34 | 41 | 49 | 56 |
| 14/128 | 13/128 | 13 | 32 | 39 | 46 | 53 |
| 13/128 | 12/128 | 12 | 29 | 36 | 42 | 49 |
| 12/128 | 11/128 | 11 | 27 | 33 | 39 | 45 |
| 11/128 | 10/128 | 10 | 25 | 30 | 36 | 41 |

TABLE 2-continued

| | | | (Range>>6)&3 rangeIdx | | | |
|---|---|---|---|---|---|---|
| | | | 0 | 1 | 2 | 3 |
| | | | range Min | | | |
| | | | 256 | 320 | 384 | 448 |
| | | | range Max | | | |
| | | | 319 | 383 | 447 | 511 |
| | | | range Mid | | | |
| Prob Max | Prob Min | probIdx | 288 | 352 | 416 | 480 |
| 10/128 | 09/128 | 9 | 23 | 28 | 33 | 38 |
| 09/128 | 08/128 | 8 | 20 | 25 | 29 | 34 |
| 08/128 | 07/128 | 7 | 18 | 22 | 26 | 30 |
| 07/128 | 06/128 | 6 | 16 | 19 | 23 | 26 |
| 06/128 | 05/128 | 5 | 14 | 17 | 20 | 23 |
| 05/128 | 04/128 | 4 | 11 | 14 | 16 | 19 |
| 04/128 | 03/128 | 3 | 9 | 11 | 13 | 15 |
| 03/128 | 02/128 | 2 | 7 | 8 | 10 | 11 |
| 02/128 | 01/128 | 1 | 5 | 6 | 7 | 8 |
| 01/128 | 00/128 | 0 | 2 | 3 | 3 | 4 |

TABLE 3

| | | | (Range>>5)&7 rangeIdx | | | | | | | |
|---|---|---|---|---|---|---|---|---|---|---|
| | | | 0 | 1 | 2 | 3 | 4 | 5 | 6 | 7 |
| | | | range Min | | | | | | | |
| | | | 256 | 288 | 320 | 352 | 384 | 416 | 448 | 480 |
| | | | range Max | | | | | | | |
| | | | 287 | 319 | 351 | 383 | 415 | 447 | 479 | 511 |
| | | | range Mid | | | | | | | |
| Prob Max | Prob Min | probIdx | 272 | 304 | 336 | 368 | 400 | 432 | 464 | 496 |
| 32/64 | 32/64 | 31 | 136 | 152 | 168 | 184 | 200 | 216 | 232 | 248 |
| 31/64 | 31/64 | 30 | 131 | 147 | 162 | 178 | 193 | 209 | 224 | 240 |
| 30/64 | 30/64 | 29 | 127 | 142 | 157 | 172 | 187 | 202 | 217 | 232 |
| 29/64 | 29/64 | 28 | 123 | 137 | 152 | 166 | 181 | 195 | 210 | 224 |
| 28/64 | 28/64 | 27 | 119 | 133 | 147 | 161 | 175 | 189 | 203 | 217 |
| 27/64 | 27/64 | 26 | 114 | 128 | 141 | 155 | 168 | 182 | 195 | 209 |
| 26/64 | 26/64 | 25 | 110 | 123 | 136 | 149 | 162 | 175 | 188 | 201 |
| 25/64 | 25/64 | 24 | 106 | 118 | 131 | 143 | 156 | 168 | 181 | 193 |
| 24/64 | 24/64 | 23 | 102 | 114 | 126 | 138 | 150 | 162 | 174 | 186 |
| 23/64 | 23/64 | 22 | 97 | 109 | 120 | 132 | 143 | 155 | 166 | 178 |
| 22/64 | 22/64 | 21 | 93 | 104 | 115 | 126 | 137 | 148 | 159 | 170 |
| 21/64 | 21/64 | 20 | 89 | 99 | 110 | 120 | 131 | 141 | 152 | 162 |
| 20/64 | 20/64 | 19 | 85 | 95 | 105 | 115 | 125 | 135 | 145 | 155 |
| 19/64 | 19/64 | 18 | 80 | 90 | 99 | 109 | 118 | 128 | 137 | 147 |
| 18/64 | 18/64 | 17 | 76 | 85 | 94 | 103 | 112 | 121 | 130 | 139 |
| 17/64 | 17/64 | 16 | 72 | 80 | 89 | 97 | 106 | 114 | 123 | 131 |
| 16/64 | 16/64 | 15 | 68 | 76 | 84 | 92 | 100 | 108 | 116 | 124 |
| 15/64 | 15/64 | 14 | 63 | 71 | 78 | 86 | 93 | 101 | 108 | 116 |
| 14/64 | 14/64 | 13 | 59 | 66 | 73 | 80 | 87 | 94 | 101 | 108 |
| 13/64 | 13/64 | 12 | 55 | 61 | 68 | 74 | 81 | 87 | 94 | 100 |
| 12/64 | 12/64 | 11 | 51 | 57 | 63 | 69 | 75 | 81 | 87 | 93 |
| 11/64 | 11/64 | 10 | 46 | 52 | 57 | 63 | 68 | 74 | 79 | 85 |
| 10/64 | 10/64 | 9 | 42 | 47 | 52 | 57 | 62 | 67 | 72 | 77 |
| 09/64 | 09/64 | 8 | 38 | 42 | 47 | 51 | 56 | 60 | 65 | 69 |
| 08/64 | 08/64 | 7 | 34 | 38 | 42 | 46 | 50 | 54 | 58 | 62 |
| 07/64 | 07/64 | 6 | 29 | 33 | 36 | 40 | 43 | 47 | 50 | 54 |
| 06/64 | 06/64 | 5 | 25 | 28 | 31 | 34 | 37 | 40 | 43 | 46 |
| 05/64 | 05/64 | 4 | 21 | 23 | 26 | 28 | 31 | 33 | 36 | 38 |
| 04/64 | 04/64 | 3 | 17 | 19 | 21 | 23 | 25 | 27 | 29 | 31 |
| 03/64 | 03/64 | 2 | 12 | 14 | 15 | 17 | 18 | 20 | 21 | 23 |
| 02/64 | 02/64 | 1 | 8 | 9 | 10 | 11 | 12 | 13 | 14 | 15 |
| 01/64 | 01/64 | 0 | 4 | 4 | 5 | 5 | 6 | 6 | 7 | 7 |

TABLE 4

| | | | (Range>>5)&7 rangeIdx | | | | | | | |
|---|---|---|---|---|---|---|---|---|---|---|
| | | | 0 | 1 | 2 | 3 | 4 | 5 | 6 | 7 |
| | | | | | | range Min | | | | |
| | | | 256 | 288 | 320 | 352 | 384 | 416 | 448 | 480 |
| | | | | | | range Max | | | | |
| | | | 287 | 319 | 351 | 383 | 415 | 447 | 479 | 511 |
| | | | | | | range Mid | | | | |
| Prob Max | Prob Min | probIdx | 272 | 304 | 336 | 368 | 400 | 432 | 464 | 496 |
| 32/64 | 32/64 | 31 | 128 | 144 | 160 | 176 | 192 | 208 | 224 | 240 |
| 31/64 | 31/64 | 30 | 124 | 139 | 155 | 170 | 186 | 201 | 217 | 232 |
| 30/64 | 30/64 | 29 | 120 | 135 | 150 | 165 | 180 | 195 | 210 | 225 |
| 29/64 | 29/64 | 28 | 116 | 130 | 145 | 159 | 174 | 188 | 203 | 217 |
| 28/64 | 28/64 | 27 | 112 | 126 | 140 | 154 | 168 | 182 | 196 | 210 |
| 27/64 | 27/64 | 26 | 108 | 121 | 135 | 148 | 162 | 175 | 189 | 202 |
| 26/64 | 26/64 | 25 | 104 | 117 | 130 | 143 | 156 | 169 | 182 | 195 |
| 25/64 | 25/64 | 24 | 100 | 112 | 125 | 137 | 150 | 162 | 175 | 187 |
| 24/64 | 24/64 | 23 | 96 | 108 | 120 | 132 | 144 | 156 | 168 | 180 |
| 23/64 | 23/64 | 22 | 92 | 103 | 115 | 126 | 138 | 149 | 161 | 172 |
| 22/64 | 22/64 | 21 | 88 | 99 | 110 | 121 | 132 | 143 | 154 | 165 |
| 21/64 | 21/64 | 20 | 84 | 94 | 105 | 115 | 126 | 136 | 147 | 157 |
| 20/64 | 20/64 | 19 | 80 | 90 | 100 | 110 | 120 | 130 | 140 | 150 |
| 19/64 | 19/64 | 18 | 76 | 85 | 95 | 104 | 114 | 123 | 133 | 142 |
| 18/64 | 18/64 | 17 | 72 | 81 | 90 | 99 | 108 | 117 | 126 | 135 |
| 17/64 | 17/64 | 16 | 68 | 76 | 85 | 93 | 102 | 110 | 119 | 127 |
| 16/64 | 16/64 | 15 | 64 | 72 | 80 | 88 | 96 | 104 | 112 | 120 |
| 15/64 | 15/64 | 14 | 60 | 67 | 75 | 82 | 90 | 97 | 105 | 112 |
| 14/64 | 14/64 | 13 | 56 | 63 | 70 | 77 | 84 | 91 | 98 | 105 |
| 13/64 | 13/64 | 12 | 52 | 58 | 65 | 71 | 78 | 84 | 91 | 97 |
| 12/64 | 12/64 | 11 | 48 | 54 | 60 | 66 | 72 | 78 | 84 | 90 |
| 11/64 | 11/64 | 10 | 44 | 49 | 55 | 60 | 66 | 71 | 77 | 82 |
| 10/64 | 10/64 | 9 | 40 | 45 | 50 | 55 | 60 | 65 | 70 | 75 |
| 09/64 | 09/64 | 8 | 36 | 40 | 45 | 49 | 54 | 58 | 63 | 67 |
| 08/64 | 08/64 | 7 | 32 | 36 | 40 | 44 | 48 | 52 | 56 | 60 |
| 07/64 | 07/64 | 6 | 28 | 31 | 35 | 38 | 42 | 45 | 49 | 52 |
| 06/64 | 06/64 | 5 | 24 | 27 | 30 | 33 | 36 | 39 | 42 | 45 |
| 05/64 | 05/64 | 4 | 20 | 22 | 25 | 27 | 30 | 32 | 35 | 37 |
| 04/64 | 04/64 | 3 | 16 | 18 | 20 | 22 | 24 | 26 | 28 | 30 |
| 03/64 | 03/64 | 2 | 12 | 13 | 15 | 16 | 18 | 19 | 21 | 22 |
| 02/64 | 02/64 | 1 | 8 | 9 | 10 | 11 | 12 | 13 | 14 | 15 |
| 01/64 | 01/64 | 0 | 4 | 4 | 5 | 5 | 6 | 6 | 7 | 7 |

In order to derive or store the LPS state only for the probability range less than 0.5, embodiments of the present invention use an inverted LPS probability if the LPS probability is greater than 0.5 or the LPS probability is greater than or equal to 0.5. In other words, whether to use the LPS probability or an inverted LPS probability (i.e., (1−LPS probability)) depends on whether the LPS probability is greater than 0.5 or whether the LPS probability is greater than or equal to 0.5. In one embodiment to derive the RangeOne (or RangeZero), for a k-bit probability ($2^k$>P>0), the LPS probability can be determined according to probLPS=(P>$2^{k-1}$) ? 2k−1−P:P. The expression "x ? y:z" means that if x is TRUE or not equal to 0, it evaluates to the value of y; otherwise, it evaluates to the value of z. The probIdx can be derived as probLPS>>(k−n−1), where the rangeLPS table has $2^n$ rows. The rangeIdx is derived as (range>>(8−m))−(256>>m), or ((range−256)>>(8−m)), or (range>>(8−m))&($2^m$−1), where the rangeLPS table has $2^m$ columns. The LPS range is derived according to rangeLPS=rangeLPSTable[probIdx][rangeIdx]. In one embodiment, if P is greater than or equal to $2^{k-1}$ (i.e., the k-th bit of P is 1), the RangeOne is derived according to RangeOne=range−rangeLPS and RangeZero is derived according to RangeOne=rangeLPS; otherwise (i.e., P is smaller than $2^{k-1}$), the RangeOne is derived according to RangeOne=rangeLPS and RangeZero is derived according to RangeZero=range−rangeLPS. In another embodiment, if P is greater than $2^{k-1}$ (i.e., the k-th bit of P is 1), the RangeOne is derived according to RangeOne=range−rangeLPS and RangeZero is derived according to RangeZero=rangeLPS; otherwise (i.e., P is equal to or smaller than $2^{k-1}$), the RangeOne is derived according to RangeOne=rangeLPS and RangeZero is derived according to RangeZero=range−rangeLPS.

In the example of JCTVC-F254 and VCEG-AZ07, k is 15, the LPS probability is determined according to probLPS=(P>=16384) ? 32767−P:P, probability index is derived according to probIdx=probLPS>>8, and range index is derived according to rangeIdx=(range>>6)&3. If P is equal to or larger than 16384, the RangeOne is derived according to RangeOne=range−rangeLPS and RangeZero is derived according to RangeZero=rangeLPS. Otherwise (i.e., P being smaller than 16384), the RangeOne is derived according to RangeOne=rangeLPS and RangeZero is derived according to RangeZero=range−rangeLPS.

The rangeLPS value can be derived by calculating (range Min)*(Prob Max), (range Min)*(Prob Mid), (range Min)*(Prob Min), (range Mid)*(Prob Max), (range Mid)*(Prob Mid), (range Mid)*(Prob Min), (range Max)*(Prob Max), (range Max)*(Prob Mid), or (range Max)*(Prob Min). The entry values in the rangeLPS table can be derived by using multiplier.

For example, if the rangeLPS table is derived according to (range Min)*(Prob Max), the entry value can be derived by using a formula. For example, for a k-bit probability ($2^k$>P>0), the LPS probability is determined according to probLPS=(P>$2^{k-1}$) ? $2^k$−1−P:P. The probIdx can be derived as probLPS>>(k−n−1), where the rangeLPS table has $2^n$ rows. The rangeIdx is derived as (range>>(8−m)), where the rangeLPS table has $2^m$ columns. The LPS range is derived according to rangeLPS=((probIdx+1)*rangeIdx)>>(k−n−m−6). In some other embodiments, the rangeIdx is derived as (range>>(q−m)), where, the rangeLPS table has $2^m$ columns, width of available values of range is $2^q$ (for example, width of available values of range in HEVC is about $2^8$ (≈510-256)) and q and m are positive integers and q is greater than m.

In the example of JCTVC-F254 and VCEG-AZ07, k is 15 and if the n is 5 and m is 3, the LPS probability is determined according to probLPS=(P>=16384) ? 32767−P:P, probIdx=probLPS>>9, rangeIdx=(range>>5). The LPS range is derived according to rangeLPS=((probIdx+1)*rangeIdx)>>1. If P is equal to or larger than 16384, the RangeOne is derived according to RangeOne=range−rangeLPS and RangeZero is derived according to RangeZero=rangeLPS. Otherwise (i.e., P being smaller than 16384), the RangeOne is derived according to RangeOne=rangeLPS and RangeZero is derived according to RangeZero=range−rangeLPS.

In another embodiment, the entry value can be derived by using a formula. For example, for a k-bit probability ($2^k$>P>0), the probability index is derived according to probIdx=(P>=$2^{k-1}$) ? $2^{n+1}$−(P>>(k−n−1)):(P>>(k−n−1))+1, where the rangeLPS table has $2^n$ rows. The rangeIdx is derived as (range>>(8−m)), where the rangeLPS table has $2^m$ columns. The LPS range is derived according to rangeLPS=(probIdx*rangeIdx)>>(k−n−m−6).

In the example of JCTVC-F254 and VCEG-AZ07, k is 15 and if the n is 5 and m is 3, the probability index is derived according to probIdx=(P>=16384) ? 64−(P>>9):(P>>9)+1, range index is derived according to rangeIdx=(range>>5). The LPS range is derived according to rangeLPS=(probIdx*rangeIdx)>>1. If P is equal to or larger than 16384, the RangeOne is derived according to RangeOne=range−rangeLPS and RangeZero is derived according to RangeZero=rangeLPS. Otherwise (i.e., P being smaller than 16384), the RangeOne is derived according to RangeOne=rangeLPS and RangeZero is derived according to RangeZero=range−rangeLPS. A "5 by 4" bits multiplier can be used to derive the (probIdx*rangeIdx).

In another embodiment, if the rangeLPS table can be derived by using a formula. For example, for a k-bit probability ($2^k$>P>0), the probability index is derived according to probIdx=(P>=$2^{k-1}$) ? $2^{n+1}$ (P>>(k−n−1)):max(1,(P>>(k−n−1))), or probIdx=(P>=$2^{k-1}$) ? $2^{n+1}$−(P>>(k−n−1))−1:max(1,(P>>(k−n−1))), where the rangeLPS table has $2^n$ rows. The rangeIdx is derived as (range>>(8−m)), where the rangeLPS table has $2^m$ columns. The LPS range is derived according to rangeLPS=(probIdx*rangeIdx)>>(k−n−m−6).

In another embodiment, an offset can be added when deriving the rangeLPS. For example, for a k-bit probability ($2^k$>P>0), the probability index can be derived according to probIdx=(P>=$2^{k-1}$) ? $2^{n+1}$ (P>>(k−n−1))−1:(P>>(k−n−1)), where the rangeLPS table has $2^n$ rows. The rangeIdx is derived as (range>>(8−m)), where the rangeLPS table has $2^m$ columns. The LPS range is derived according to rangeLPS=(probIdx*rangeIdx)>>(k−n−m−6)+(rangeIdx>>(k−n−m−5)), the rangeLPS=(probIdx*rangeIdx)>>(k−n−m−6)+(rangeIdx>>(k−n−m−6)), or rangeLPS=(probIdx*rangeIdx+offset)>>(k−n−m−6), or rangeLPS=(probIdx*rangeIdx+offset)>>(k−n−m−6)+offset, where k, n and m are non-negative integers.

In another embodiment, an offset can be added to deriving probIdx and/or rangeIdx. For example, the newProbIdx can be equal to a*probIdx+b, where a can be 1, 2, or any integer, b can be 0, 1, 2, or any integer. The newRangeIdx can be equal to c*rangeIdx+d, where c can be 1, 2, or any integer, d can be 0, 1, 2, or any integer. The rangeLPS can be equal to (newProbIdx*newRangeIdx+e)>>f+g, where e, f and g are non-negative integers.

For example, for a k-bit probability ($2^k$>P>0), the probability index can be derived according to probIdx=(P>=$2^{k-1}$) ? $2^{n+1}$ (P>>(k−n−1)):(P>>(k−n−1))+1, or the probIdx=(P>=$2^{k-1}$) ? $2^{n+1}$−(P>>(k−n−1))−1:(P>>(k−n−1)). The rangeIdx is derived as (range>>(8−m)). The LPS range is derived according to rangeLPS=(probIdx*(2*rangeIdx+1))>>(k−n−m−5), where k, n and m are non-negative integers.

In another example, for a k-bit probability ($2^k$>P>0), the probability index can be derived according to probIdx=(P>=$2^{k-1}$) ? $2^{n+1}$−(P>>(k−n−1)):(P>>(k−n−1))+1, or probIdx=(P>=$2^{k-1}$) ? $2^{n+1}$−(P>>(k−n−1))−1:(P>>(k−n−1)). The rangeIdx is derived as (range>>(8−m)). The LPS range is derived according to rangeLPS=((2*probIdx−1)*(2*rangeIdx+1))>>(k−n−m−4).

In another example, for a k-bit probability ($2^k$>P>0), the probability index can be derived according to probIdx=(P>=$2^{k-1}$) ? $2^{n+1}$−(P>>(k−n−1)):(P>>(k−n−1))+1, or probIdx=(P>=$2^{k-1}$) ? $2^{n+1}$−(P>>(k−n−1))−1:(P>>(k−n−1)). The rangeIdx is derived as (range>>(8−m)). The LPS range is derived according to rangeLPS=((2*probIdx+1)*(2*rangeIdx+1))>>(k−n−m−4).

In another example, for a k-bit probability ($2^k$>P>0), the probability index can be derived according to probIdx=(P>=$2^{k-1}$) ? $2^{n+1}$−(P>>(k−n−1)):(P>>(k−n−1))+1, or probIdx=(P>=$2^{k-1}$) ? $2^{n+1}$−(P>>(k−n−1))−1:(P>>(k−n−1)). The rangeIdx is derived as (range>>(8−m)). The LPS range is derived according to rangeLPS=((2*probIdx+1)*rangeIdx)>>(k−n−m−5).

In another example, for a k-bit probability ($2^k$>P>0), the probability index can be derived according probIdx=(P>=$2^{k-1}$) ? $2^{n+1}$−(P>>(k−n−1)):(P>>(k−n−1))+1, or the probIdx=(P>=$2^{k-1}$) ? $2^{n+1}$−(P>>(k−n−1))−1:(P>>(k−n−1)). The rangeIdx is derived as (range>>(8−m)). The LPS range is derived according to rangeLPS=((probIdx+1)*rangeIdx)>>(k−n−m−6).

Note that, since the $2^k$−1 is all ones in binary representation, the $2^k$−1−P is just to do the bitwise inverse for k bits of P. In hardware implementation, we can do bitwise exclusive or (XOR) for the k-th bit of P and the 1 to k-th bits of P to derive the probLPS.

In general, the rangeLPS can be derived by a mathematical calculation which includes multiplying the probIdx and rangeIdx. The probIdx can be derived by right shifting the probability of the current bin by N bits depending on whether the current probability value is greater than or is equal to or greater than $2^{k-1}$ when the current probability is represented by k-bit values, where N is a positive integer. The rangeIdx is derived by right-shifting the current range by M bits, where M is a positive integer.

In some implementation method, the result of LPS range is stored in a pre-defined look up table; and the LPS range is derived by using table look up; where the row index and column index of the look up table are corresponding to the LPS probability index and range index.

In another implementation method, we can duplicate the rangeLPS table to reduce the computation complexity. Table 5 shows the mirrored table of Table 4. The entries are mirrored in the boundary between the probIdx 31 and 32. By using this kind of rangeLPS table, the probIdx can be derived by probIdx=P>>(k−n) directly, where the rangeLPS table has $2^n$ rows.

For example, if the k is 15, n is 6, m is 3, k=15, n=6, m=3. The probability index is derived according to probIdx=P>>9, rangeIdx=(range>>5)&7. If P is equal to or larger than 16384 (i.e., the 15-th bit of P is 1), the RangeOne is derived according to RangeOne=range−rangeLPS and RangeZero is derived according to RangeZero=rangeLPS. Otherwise (i.e., P being smaller than 16384), the RangeOne is derived according to RangeOne=rangeLPS and RangeZero is derived according to RangeZero=range−rangeLPS.

In Table 4 and 5, the entry value of rangeLPS won't necessary be clipped to be larger than a threshold.

TABLE 5

| | | | (Range>>5)&7 rangeIdx | | | | | | | |
|---|---|---|---|---|---|---|---|---|---|---|
| | | | 0 | 1 | 2 | 3 | 4 | 5 | 6 | 7 |
| | | | | | | range Min | | | | |
| | | | 256 | 288 | 320 | 352 | 384 | 416 | 448 | 480 |
| | | | | | | range Max | | | | |
| | | | 287 | 319 | 351 | 383 | 415 | 447 | 479 | 511 |
| | | | | | | range Mid | | | | |
| Prob Max | Prob Min | probIdx | 272 | 304 | 336 | 368 | 400 | 432 | 464 | 496 |
| 01/64 | 01/64 | 63 | 4 | 4 | 5 | 5 | 6 | 6 | 7 | 7 |
| 02/64 | 02/64 | 62 | 8 | 9 | 10 | 11 | 12 | 13 | 14 | 15 |
| 03/64 | 03/64 | 61 | 12 | 13 | 15 | 16 | 18 | 19 | 21 | 22 |
| 04/64 | 04/64 | 60 | 16 | 18 | 20 | 22 | 24 | 26 | 28 | 30 |
| 05/64 | 05/64 | 59 | 20 | 22 | 25 | 27 | 30 | 32 | 35 | 37 |
| 06/64 | 06/64 | 58 | 24 | 27 | 30 | 33 | 36 | 39 | 42 | 45 |
| 07/64 | 07/64 | 57 | 28 | 31 | 35 | 38 | 42 | 45 | 49 | 52 |
| 08/64 | 08/64 | 56 | 32 | 36 | 40 | 44 | 48 | 52 | 56 | 60 |
| 09/64 | 09/64 | 55 | 36 | 40 | 45 | 49 | 54 | 58 | 63 | 67 |
| 10/64 | 10/64 | 54 | 40 | 45 | 50 | 55 | 60 | 65 | 70 | 75 |
| 11/64 | 11/64 | 53 | 44 | 49 | 55 | 60 | 66 | 71 | 77 | 82 |
| 12/64 | 12/64 | 52 | 48 | 54 | 60 | 66 | 72 | 78 | 84 | 90 |
| 13/64 | 13/64 | 51 | 52 | 58 | 65 | 71 | 78 | 84 | 91 | 97 |
| 14/64 | 14/64 | 50 | 56 | 63 | 70 | 77 | 84 | 91 | 98 | 105 |
| 15/64 | 15/64 | 49 | 60 | 67 | 75 | 82 | 90 | 97 | 105 | 112 |
| 16/64 | 16/64 | 48 | 64 | 72 | 80 | 88 | 96 | 104 | 112 | 120 |
| 17/64 | 17/64 | 47 | 68 | 76 | 85 | 93 | 102 | 110 | 119 | 127 |
| 18/64 | 18/64 | 46 | 72 | 81 | 90 | 99 | 108 | 117 | 126 | 135 |
| 19/64 | 19/64 | 45 | 76 | 85 | 95 | 104 | 114 | 123 | 133 | 142 |
| 20/64 | 20/64 | 44 | 80 | 90 | 100 | 110 | 120 | 130 | 140 | 150 |
| 21/64 | 21/64 | 43 | 84 | 94 | 105 | 115 | 126 | 136 | 147 | 157 |
| 22/64 | 22/64 | 42 | 88 | 99 | 110 | 121 | 132 | 143 | 154 | 165 |
| 23/64 | 23/64 | 41 | 92 | 103 | 115 | 126 | 138 | 149 | 161 | 172 |
| 24/64 | 24/64 | 40 | 96 | 108 | 120 | 132 | 144 | 156 | 168 | 180 |
| 25/64 | 25/64 | 39 | 100 | 112 | 125 | 137 | 150 | 162 | 175 | 187 |
| 26/64 | 26/64 | 38 | 104 | 117 | 130 | 143 | 156 | 169 | 182 | 195 |
| 27/64 | 27/64 | 37 | 108 | 121 | 135 | 148 | 162 | 175 | 189 | 202 |
| 28/64 | 28/64 | 36 | 112 | 126 | 140 | 154 | 168 | 182 | 196 | 210 |
| 29/64 | 29/64 | 35 | 116 | 130 | 145 | 159 | 174 | 188 | 203 | 217 |
| 30/64 | 30/64 | 34 | 120 | 135 | 150 | 165 | 180 | 195 | 210 | 225 |
| 31/64 | 31/64 | 33 | 124 | 139 | 155 | 170 | 186 | 201 | 217 | 232 |
| 32/64 | 32/64 | 32 | 128 | 144 | 160 | 176 | 192 | 208 | 224 | 240 |
| 32/64 | 32/64 | 31 | 128 | 144 | 160 | 176 | 192 | 208 | 224 | 240 |
| 31/64 | 31/64 | 30 | 124 | 139 | 155 | 170 | 186 | 201 | 217 | 232 |
| 30/64 | 30/64 | 29 | 120 | 135 | 150 | 165 | 180 | 195 | 210 | 225 |
| 29/64 | 29/64 | 28 | 116 | 130 | 145 | 159 | 174 | 188 | 203 | 217 |
| 28/64 | 28/64 | 27 | 112 | 126 | 140 | 154 | 168 | 182 | 196 | 210 |
| 27/64 | 27/64 | 26 | 108 | 121 | 135 | 148 | 162 | 175 | 189 | 202 |
| 26/64 | 26/64 | 25 | 104 | 117 | 130 | 143 | 156 | 169 | 182 | 195 |
| 25/64 | 25/64 | 24 | 100 | 112 | 125 | 137 | 150 | 162 | 175 | 187 |
| 24/64 | 24/64 | 23 | 96 | 108 | 120 | 132 | 144 | 156 | 168 | 180 |
| 23/64 | 23/64 | 22 | 92 | 103 | 115 | 126 | 138 | 149 | 161 | 172 |
| 22/64 | 22/64 | 21 | 88 | 99 | 110 | 121 | 132 | 143 | 154 | 165 |
| 21/64 | 21/64 | 20 | 84 | 94 | 105 | 115 | 126 | 136 | 147 | 157 |
| 20/64 | 20/64 | 19 | 80 | 90 | 100 | 110 | 120 | 130 | 140 | 150 |
| 19/64 | 19/64 | 18 | 76 | 85 | 95 | 104 | 114 | 123 | 133 | 142 |
| 18/64 | 18/64 | 17 | 72 | 81 | 90 | 99 | 108 | 117 | 126 | 135 |
| 17/64 | 17/64 | 16 | 68 | 76 | 85 | 93 | 102 | 110 | 119 | 127 |
| 16/64 | 16/64 | 15 | 64 | 72 | 80 | 88 | 96 | 104 | 112 | 120 |
| 15/64 | 15/64 | 14 | 60 | 67 | 75 | 82 | 90 | 97 | 105 | 112 |
| 14/64 | 14/64 | 13 | 56 | 63 | 70 | 77 | 84 | 91 | 98 | 105 |
| 13/64 | 13/64 | 12 | 52 | 58 | 65 | 71 | 78 | 84 | 91 | 97 |
| 12/64 | 12/64 | 11 | 48 | 54 | 60 | 66 | 72 | 78 | 84 | 90 |
| 11/64 | 11/64 | 10 | 44 | 49 | 55 | 60 | 66 | 71 | 77 | 82 |

TABLE 5-continued

| | | | (Range>>5)&7 rangeIdx | | | | | | | |
|---|---|---|---|---|---|---|---|---|---|---|
| | | | 0 | 1 | 2 | 3 | 4 | 5 | 6 | 7 |
| | | | | | | range Min | | | | |
| | | | 256 | 288 | 320 | 352 | 384 | 416 | 448 | 480 |
| | | | | | | range Max | | | | |
| | | | 287 | 319 | 351 | 383 | 415 | 447 | 479 | 511 |
| | | | | | | range Mid | | | | |
| Prob Max | Prob Min | probIdx | 272 | 304 | 336 | 368 | 400 | 432 | 464 | 496 |
| 10/64 | 10/64 | 9 | 40 | 45 | 50 | 55 | 60 | 65 | 70 | 75 |
| 09/64 | 09/64 | 8 | 36 | 40 | 45 | 49 | 54 | 58 | 63 | 67 |
| 08/64 | 08/64 | 7 | 32 | 36 | 40 | 44 | 48 | 52 | 56 | 60 |
| 07/64 | 07/64 | 6 | 28 | 31 | 35 | 38 | 42 | 45 | 49 | 52 |
| 06/64 | 06/64 | 5 | 24 | 27 | 30 | 33 | 36 | 39 | 42 | 45 |
| 05/64 | 05/64 | 4 | 20 | 22 | 25 | 27 | 30 | 32 | 35 | 37 |
| 04/64 | 04/64 | 3 | 16 | 18 | 20 | 22 | 24 | 26 | 28 | 30 |
| 03/64 | 03/64 | 2 | 12 | 13 | 15 | 16 | 18 | 19 | 21 | 22 |
| 02/64 | 02/64 | 1 | 8 | 9 | 10 | 11 | 12 | 13 | 14 | 15 |
| 01/64 | 01/64 | 0 | 4 | 4 | 5 | 5 | 6 | 6 | 7 | 7 |

Figure 3:
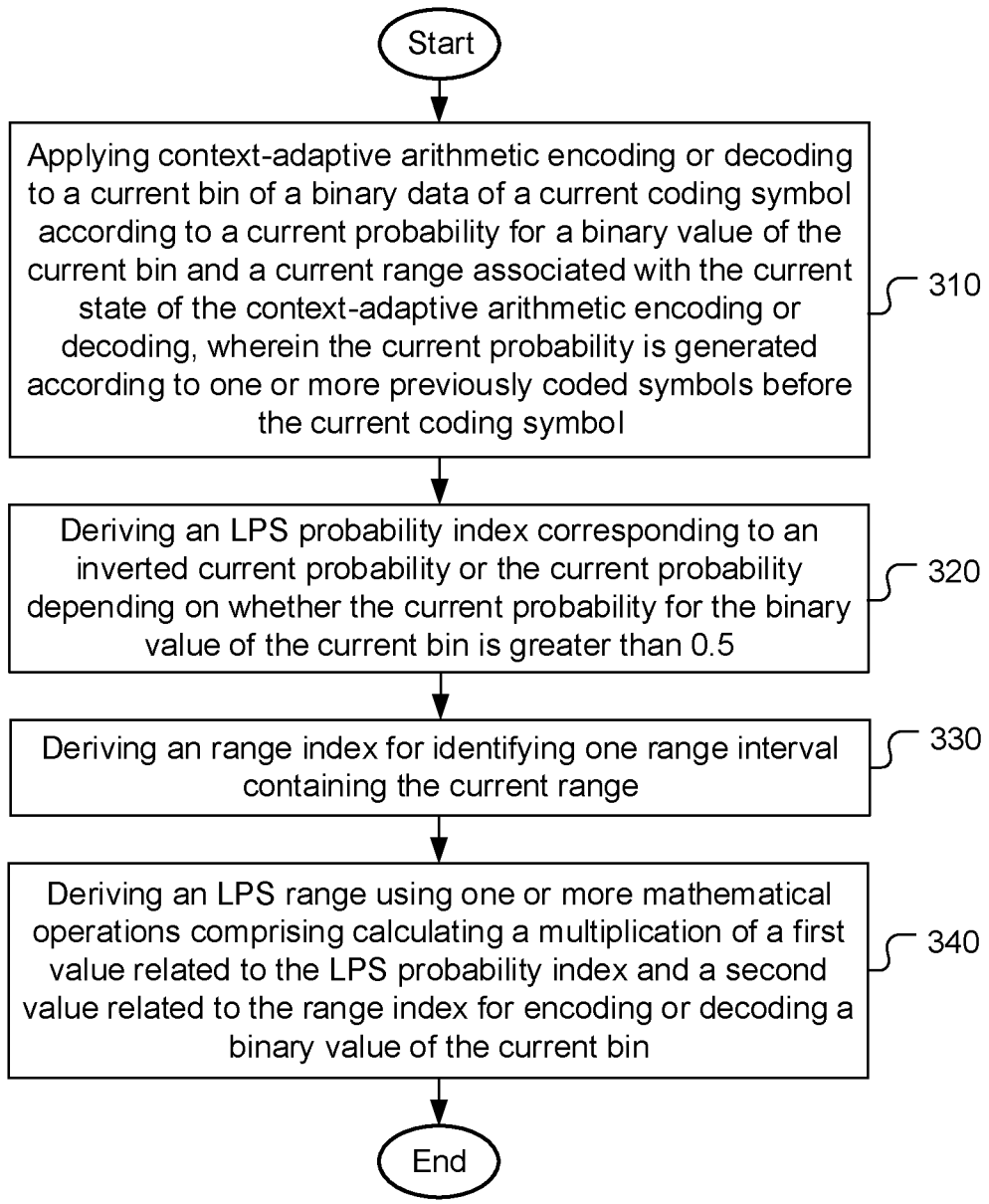
FIG. 3 illustrates an exemplary flowchart of context-based adaptive binary arithmetic coding (CABAC) according to one embodiment of the present invention.

FIG. 3 illustrates an exemplary flowchart of context-based adaptive binary arithmetic coding (CABAC) according to one embodiment of the present invention. The steps shown in the flowchart, as well as other flowcharts in this disclosure, may be implemented as program codes executable on one or more processors (e.g., one or more CPUs) at the encoder side and/or the decoder side. The steps shown in the flowchart may also be implemented based on hardware such as one or more electronic devices or processors arranged to perform the steps in the flowchart. According to this embodiment, context-adaptive arithmetic encoding or decoding is applied to a current bin of a binary data of a current coding symbol according to a current probability for a binary value of the current bin and a current range associated with the current state of the arithmetic coder, wherein the current probability is generated according to one or more previously coded symbols before the current coding symbol in step 310. For a video coding system, the coding symbols may correspond to transformed and quantized prediction residues, motion information for Inter predicted block, and various coding parameters such as coding modes. The coding symbols are binarized to generate a binary string. The CABAC coding may be applied to the binary string. An LPS probability index corresponding to an inverted current probability or the current probability is derived in step 320 depending on whether the current probability for the binary value of the current bin is greater than 0.5 (or $2^{k-1}$ if the current probability is represented by k-bit values). Various ways to derive the LPS probability index has been disclosed in this application. For example, if the current probability for the binary value of the current bin is greater than 0.5, an LPS (least-probably-symbol) probability is set equal to (1—the current probability) and otherwise, the LPS probability is set equal to the current probability; and the LPS probability index is determined based on a target index indicating one probability interval containing the current probability. A range index is derived for identifying one range interval containing the current range in step 330. Various ways to derive the range index has been disclosed in this application. For example, the range index can be derived by right-shifting the current probability by (8−m) bits, wherein m is a positive integer. A LPS range is then derived using one or more mathematical operations comprising calculating a multiplication of a first value related to the LPS probability index and a second value related to the LPS range index for encoding or decoding a binary value of the current bin in step 340.

The flowcharts shown are intended to illustrate an example of video coding according to the present invention. A person skilled in the art may modify each step, re-arranges the steps, split a step, or combine steps to practice the present invention without departing from the spirit of the present invention. In the disclosure, specific syntax and semantics have been used to illustrate examples to implement embodiments of the present invention. A skilled person may practice the present invention by substituting the syntax and semantics with equivalent syntax and semantics without departing from the spirit of the present invention.

The above description is presented to enable a person of ordinary skill in the art to practice the present invention as provided in the context of a particular application and its requirement. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed. In the above detailed description, various specific details are illustrated in order to provide a thorough understanding of the present invention. Nevertheless, it will be understood by those skilled in the art that the present invention may be practiced.

Embodiment of the present invention as described above may be implemented in various hardware, software codes, or a combination of both. For example, an embodiment of the present invention can be one or more circuit circuits integrated into a video compression chip or program code integrated into video compression software to perform the processing described herein. An embodiment of the present invention may also be program code to be executed on a Digital Signal Processor (DSP) to perform the processing described herein. The invention may also involve a number of functions to be performed by a computer processor, a digital signal processor, a microprocessor, or field programmable gate array (FPGA). These processors can be configured to perform particular tasks according to the invention, by executing machine-readable software code or firmware code that defines the particular methods embodied by the invention. The software code or firmware code may be developed in different programming languages and different formats or styles. The software code may also be compiled for different target platforms. However, different code formats, styles and languages of software codes and other means of configuring code to perform the tasks in accordance with the invention will not depart from the spirit and scope of the invention.

The invention may be embodied in other specific forms without departing from its spirit or essential characteristics. The described examples are to be considered in all respects only as illustrative and not restrictive. The scope of the invention is therefore, indicated by the appended claims rather than by the foregoing description. All changes which come within the meaning and range of equivalency of the claims are to be embraced within their scope.

The invention claimed is:

1. A method of entropy coding of coding symbols, the method comprising:
    applying context-adaptive arithmetic encoding or decoding to a current bin of a binary data of a current coding symbol according to a current probability for a binary value of the current bin and a current range associated with a current state of the context-adaptive arithmetic encoding or decoding, wherein the current probability is generated according to one or more previously coded symbols before the current coding symbol;
    deriving a least-probable-symbol (LPS) probability index corresponding to an inverted current probability or the current probability depending on whether the current probability of the current bin is greater than or equal to $2^{k-1}$, k being a positive integer;
    deriving a range index for identifying one range interval containing the current range; and
    deriving an LPS range using one or more mathematical operations comprising calculating a multiplication of the LPS probability index and the range index for encoding or decoding a binary value of the current bin.

2. The method of claim 1, wherein if the current probability for the binary value of the current bin is greater than 0.5, an LPS probability is set equal to (1–the current probability) and otherwise, the LPS probability is set equal to the current probability; and the LPS probability index is determined based on a target index indicating one probability interval containing the current probability.

3. The method of claim 1, further comprising deriving, from the current range, a rangeOne value and a rangeZero value for the current bin having a value of one and a value of zero respectively, wherein if the current probability for the binary value of the current bin is either greater than 0.5, or is greater than or equal to 0.5, the rangeOne value is set to (the current range–the LPS range) and the rangeZero value is set to the LPS range; and otherwise, the rangeZero value is set to (the current range–the LPS range) and the rangeOne value is set to the LPS range.

4. The method of claim 1, wherein the LPS range is derived by multiplying the LPS probability index and the range index or by multiplying (the LPS probability index plus 1) and the range index to obtain a multiplication result, and right-shifting the multiplication result by an x bits and x is a positive integer.

5. The method of claim 1, wherein the LPS range is derived by multiplying the LPS probability index and the range index or by multiplying (the LPS probability index plus 1) and the range index to obtain a multiplication result, and right-shifting the multiplication result plus an offset by an x bits and x is a positive integer, wherein the offset is a positive integer or a value corresponding to the range index or the current range.

6. The method of claim 5, wherein the x corresponds to (k–n–m–6), and wherein the current probability is represented by k-bit values, and n and m are positive integers.

7. The method of claim 1, wherein the current probability is represented by k-bit values and the LPS probability index is derived using operations comprising right-shifting the current probability by (k–n–1) bits, wherein n is a positive integer.

8. The method of claim 1, wherein the current probability is represented by k-bit values and the LPS probability index is derived using a result of right-shifting the current probability by (k–n–1) bits or using an inverted result of right-shifting the current probability by (k–n–1) bits depending on either whether the current probability is greater than 2k–1, or whether the current probability is greater than or equal to 2k–1, wherein n is a positive integer.

9. The method of claim 8, wherein the range index is derived by right-shifting the current range by (q–m) bits, wherein q and m are positive integers and q is greater than m.

10. The method of claim 1, wherein the LPS probability index corresponds to a minimum LPS probability value, a maximum LPS probability value or a middle LPS probability value of a probability interval associated with the LPS probability index.

11. The method of claim 1, wherein the the range index corresponds to a minimum range value, a maximum range value or a middle range value of a range interval associated with the range index.

12. The method of claim 1, wherein a result of LPS range is stored in a pre-defined look up table; and the LPS range is derived by using table look up; and where a row index and a column index of the pre-defined look up table correspond to the LPS probability index and the range index respectively.

13. An entropy coding apparatus for an image or video encoder or decoder, the entropy coding apparatus comprising:
    a binary arithmetic coder arranged to apply context-adaptive arithmetic encoding or decoding to a current bin of a binary data of a current coding symbol according to a current probability for a binary value of the current bin and a current range associated with a current state of the binary arithmetic coder, wherein the current probability is generated according to one or more previously coded symbols before the current coding symbol; and
    a context model unit arranged to:
    derive a least-probable-symbol (LPS) probability index corresponding to an inverted current probability or the current probability depending on whether the current probability of the current bin is greater than or equal to $2^{k-1}$, k being a positive integer;
    derive a range index for identifying one range interval containing the current range; and
    derive a LPS range using one or more mathematical operations comprising calculating a multiplication of the LPS probability index and the range index for encoding or decoding a binary value of the current bin.

14. The entropy coding apparatus of claim 13, wherein if the current probability for the binary value of the current bin is greater than 0.5, an LPS probability is set equal to (1–the current probability) and otherwise, the LPS probability is set equal to the current probability; and the LPS probability index is determined based on a target index indicating one probability interval containing the current probability.

15. A non-transitory computer readable medium storing program instructions causing a processing circuit of an apparatus to perform a video coding method, and the method comprising:

applying context-adaptive arithmetic encoding or decoding to a current bin of a binary data of a current coding symbol according to a current probability for a binary value of the current bin and a current range associated with a current state of the context-adaptive arithmetic encoding or decoding, wherein the current probability is generated according to one or more previously coded symbols before the current coding symbol;

deriving a least-probable-symbol (LPS) probability index corresponding to an inverted current probability or the current probability depending on whether the current probability of the current bin is greater than or equal to $2^{k-1}$, k being a positive integer;

deriving a range index for identifying one range interval containing the current range; and deriving a LPS range using one or more mathematical operations comprising calculating a multiplication of the LPS probability index and the range index for encoding or decoding a binary value of the current bin.

* * * * *